United States Patent
Lu et al.

(10) Patent No.: US 9,930,804 B2
(45) Date of Patent: Mar. 27, 2018

(54) SERVER DEVICE

(71) Applicant: WISTRON CORP., New Taipei (TW)

(72) Inventors: Fu-Lung Lu, New Taipei (TW);
Wen-Tsan Yen, New Taipei (TW);
Jun-Hao Wang, New Taipei (TW);
Yu-Syuan Lin, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 15/283,371

(22) Filed: Oct. 1, 2016

(65) Prior Publication Data
US 2018/0054908 A1    Feb. 22, 2018

(30) Foreign Application Priority Data

Aug. 18, 2016 (TW) .............................. 105126445 A

(51) Int. Cl.
H05K 7/00 (2006.01)
H05K 5/00 (2006.01)
H05K 7/14 (2006.01)

(52) U.S. Cl.
CPC .................................. *H05K 7/1488* (2013.01)

(58) Field of Classification Search
CPC ....................................................... G06F 1/187
USPC ................................................... 361/679.01
See application file for complete search history.

(56) References Cited

U.S. PATENT DOCUMENTS

| 4,003,614 A | * | 1/1977 | Geer | ...................... E05B 65/46 |
| | | | | 292/240 |
| 8,369,080 B2 | * | 2/2013 | Huang | .................... G06F 1/187 |
| | | | | 361/679.37 |
| 9,389,651 B2 | | 7/2016 | Brockett et al. | |
| 2008/0084673 A1 | * | 4/2008 | Hsiung | ................ H05K 7/1489 |
| | | | | 361/724 |
| 2009/0086441 A1 | * | 4/2009 | Randall | ................ H05K 7/1492 |
| | | | | 361/724 |

FOREIGN PATENT DOCUMENTS

TW    M463962 U    10/2013

OTHER PUBLICATIONS

TW Office Action dated Dec. 27, 2016 as received in Application No. 105126445 (English Translation).

* cited by examiner

*Primary Examiner* — Jerry Wu
(74) *Attorney, Agent, or Firm* — Maschoff Brennan

(57) ABSTRACT

A server device including a chassis having an accommodating space and an opening, a least one server having a front part and a back part, and at least one connecting rod assembly having a first connecting rod, a second connecting rod, and a third connecting rod. The server may be located in the accommodating space and be drawable from the opening. The first connecting rod is pivoted on the front part of the server. The second connecting rod is pivoted on the back part of the at least one server. An end of the third connecting rod is pivoted on the first connecting rod, and another end of the third connecting rod is pivoted on the second connecting rod. The first connecting rod is rotatable relative to the server to move the third connecting rod, so that the second connecting rod is fastened to the chassis.

9 Claims, 6 Drawing Sheets

SERVER DEVICE

CROSS-REFERENCE TO RELATED APPLICATIONS

This non-provisional application claims priority under 35 U.S.C. § 119(a) on Patent Application No(s). 105126445 filed in Taiwan R.O.C. on Aug. 18, 2016, the entire contents of which are hereby incorporated by reference.

TECHNICAL FIELD

The present disclosure provides a server device, more particularly to a server device having a connecting rod assembly.

BACKGROUND

Currently, we are in a time where information technology is rapidly developing. A personal computer, such as a desktop computer, a notebook computer, and so on, is used for general usage. With the development of communication technology, there is a tendency to do more international business instead of traditionally only doing regional business. However, the personal computer cannot satisfy the demands of businesses. Hence, various servers have been developed by computer companies, such as a 2U server, a rack-mount server, a blade server or a standard server, and so on, to solve problems for performing e-business in enterprises.

As an example of the blade servers, the servers are arranged in parallel and located horizontally in a chassis. Additionally a handle type latch is further mounted on the front end of the server, so that the server is fixed in the chassis by the handle type latch. However, the width of the chassis cannot be widened; therefore the handle type latch and the adjacent servers may easily interfere with each other because of the adjacent servers being too close to each other. Although interference between the handle type latch and the adjacent servers can be lessened by reducing the protrusion of the handle type latch, the handle type latch does not protrude enough, so that the server is still difficult to effectually fix on the chassis.

SUMMARY

The present disclosure provides a server device to solve the problems in the prior art and is described as follows. If the protrusion of the handle type latch is maintained, the handle type latch and the adjacent servers may interfere with each other; and if the protrusion of the latch is reduced, the server is difficult to fix effectually in the chassis.

One embodiment of the present disclosure discloses a server device, including a chassis, at least one server, and at least one connecting rod assembly. The chassis has an accommodating space and an opening, and the opening is connected to the accommodating space. The at least one server may be located in the accommodating space and be drawable from the opening. The at least one server includes a front part and a back part. The back part is farther from the opening than the front part, and a width of the front part is greater than a width of the back part. The at least one connecting rod assembly is disposed on the at least one server. The at least one connecting rod assembly includes a first connecting rod, a second connecting rod, and a third connecting rod. The first connecting rod is pivoted on the front part of the at least one server. The second connecting rod is pivoted on the back part of the server. An end of the third connecting rod is pivoted on the first connecting rod, and another end of the third connecting rod is pivoted on the second connecting rod; wherein the first connecting rod may be rotatable relative to the at least one server to move the third connecting rod, so that the third connecting rod drives the second connecting rod to protrude from a side surface of the back part and be fastened to the chassis.

According to the server device of the aforementioned embodiment, a fastening position of the second connecting rod is moved back to a back section of a partition plate by pivoting the third connecting rod. Therefore, a length for fastening the second connecting rod to a fastening slot may be further lengthened on the basis of that the adjacent servers do not interfere with each other. Hence, the assembly reliability of the servers and chassis are enhanced.

BRIEF DESCRIPTION OF THE DRAWINGS

The present invention will become more understood from the detailed description given herein below and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
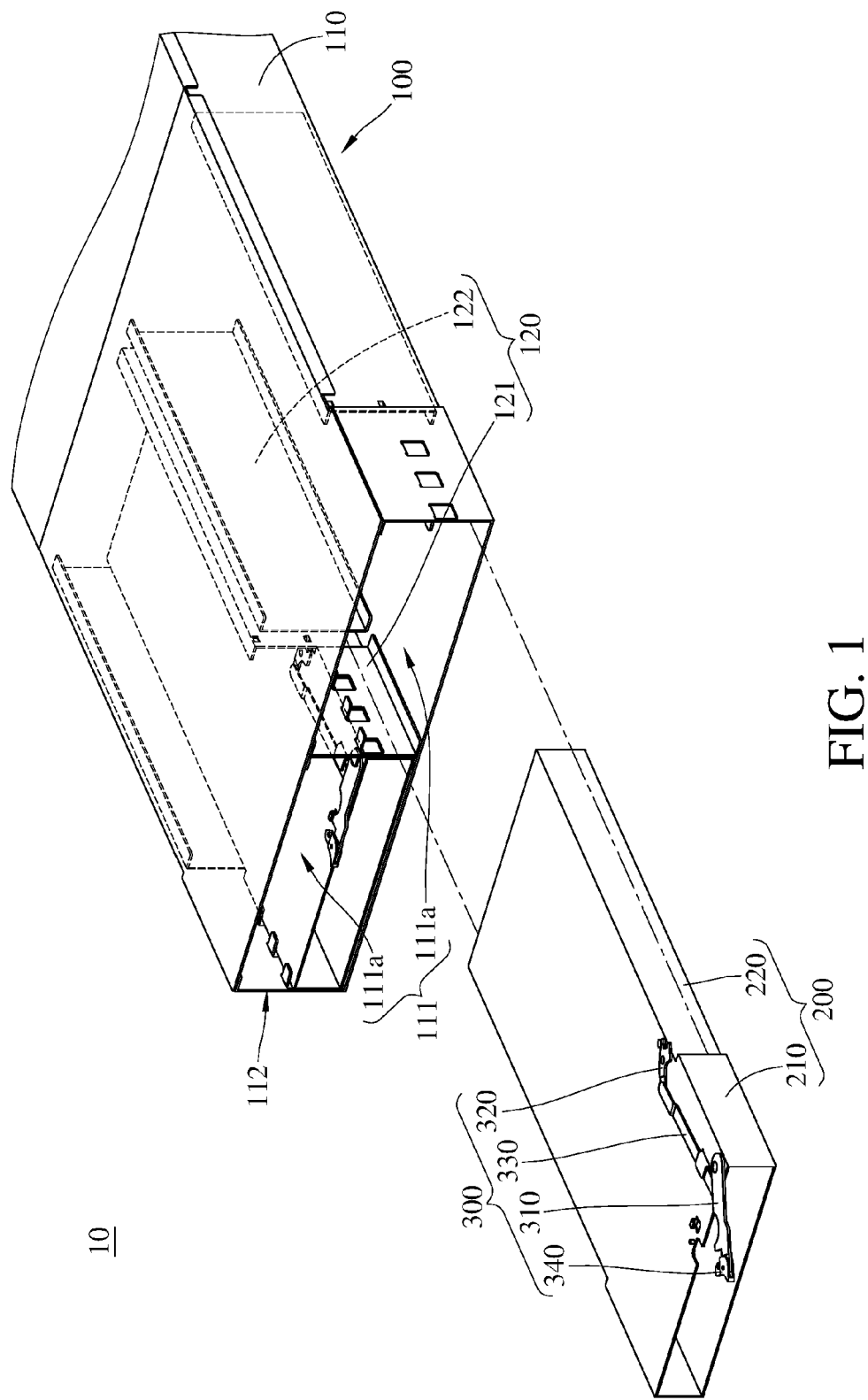
FIG. 1 is a schematic perspective view of a server device according to a first embodiment of the present invention.
Figure 2:
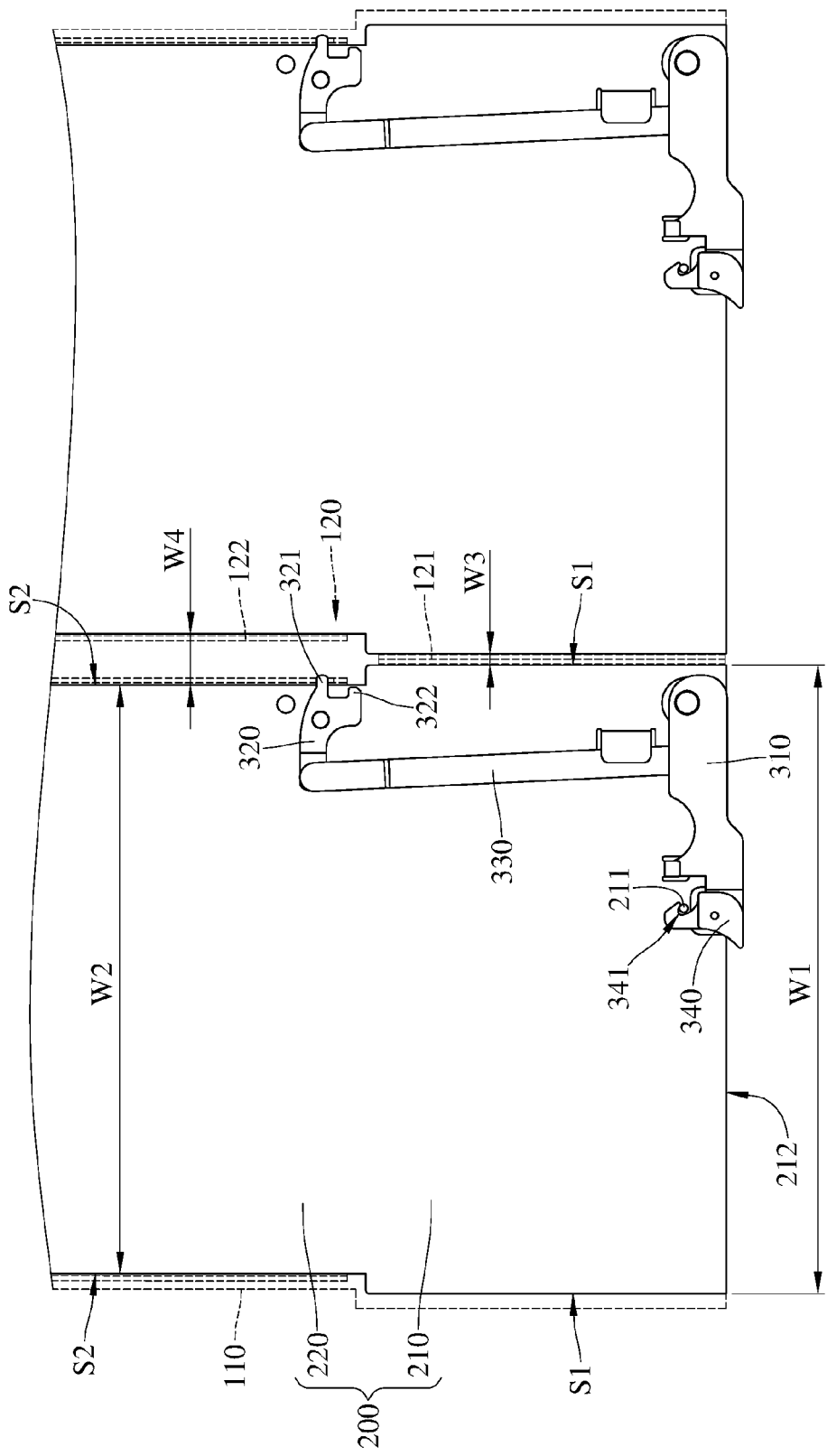
FIG. 2 is a top perspective view of a part of disposing the server device in a chassis in FIG. 1.
Figure 3:
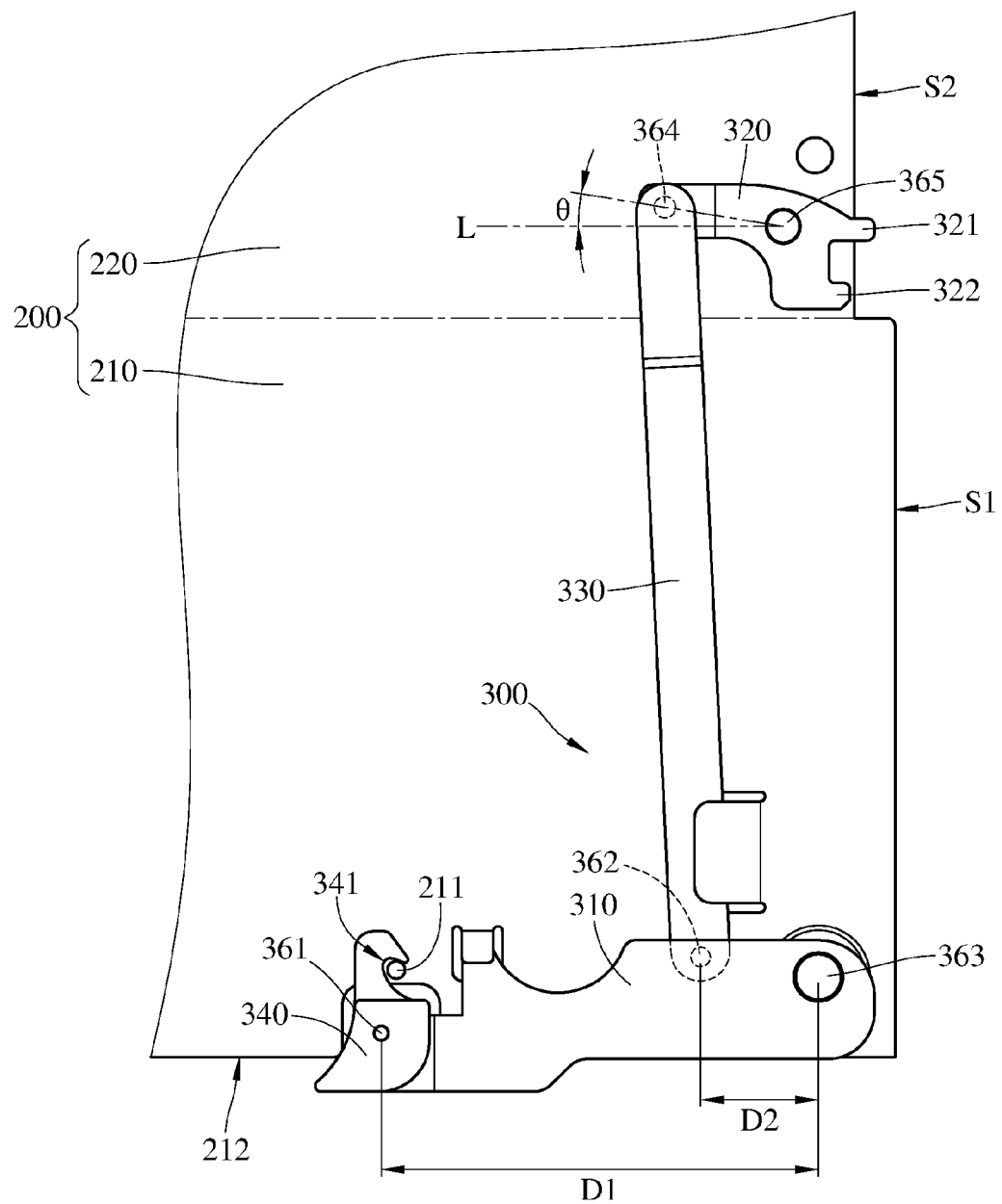
FIG. 3 is a plane perspective view of the server device in FIG. 2.
Figure 4:
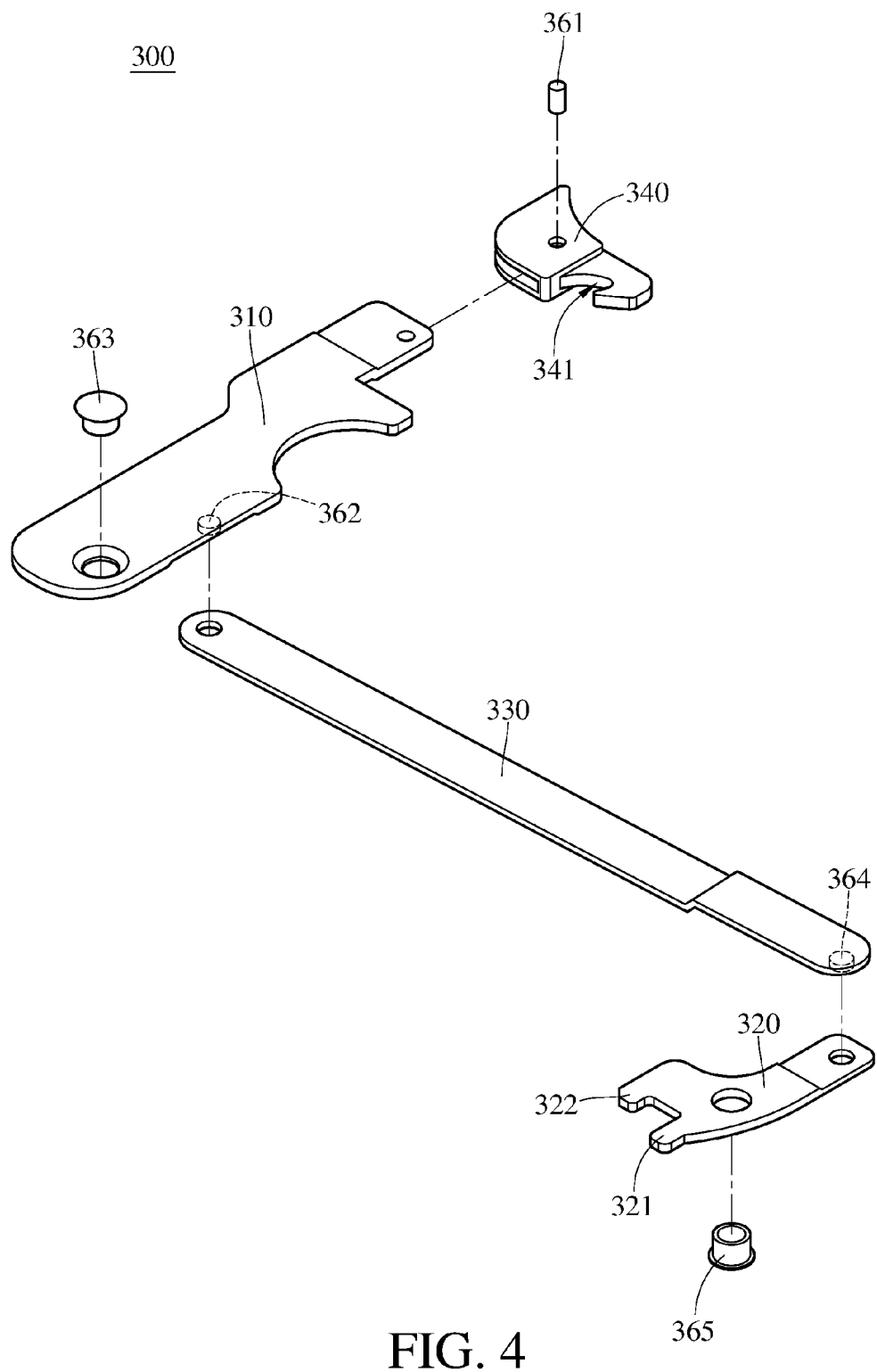
FIG. 4 is a exploded view of a connecting rod assembly in FIG. 2.

Please refer to FIG. 1 to FIG. 4. FIG. 1 is a schematic perspective view of a server device according to a first embodiment of the present invention. FIG. 2 is a top perspective view of a part of disposing the server device in a chassis in FIG. 1. FIG. 3 is a plane perspective view of the server device in FIG. 2. FIG. 4 is an exploded view of a connecting rod assembly in FIG. 2.

In this embodiment, the server device 10 includes a chassis 100, two servers 200, and two connecting rod assemblies 300. The chassis 100 includes a case body 110 and a partition plate 120. The case body 110 has an accommodating space 111 and an opening 112 connected to the accommodating space 111. The partition plate 120 is located in the accommodating space 111, and the accommodating space 111 is divided into two subspaces 111a. The partition plate 120 includes a front section 121 and a back section 122. The back section 122 is farther from the opening 12 than the front section 121, and a width W3 of the front section 121 is less than a width W4 of the back section 122. The back section 122 of the partition plate 120 also has a fastening slot 122a.

The two servers 200 may be respectively located in the two subspaces 111a and be drawable from the opening 112. Each of the two servers 200 includes a front part 210 and a back part 220. For each server 200, the back part 220 is farther from the opening 112 than the front part 210 and the width W1 of the front part 210 is greater than the width W2 of the back part 220. In other words, the distance between two side surfaces S2 of the back part 220 is narrower than the distance between two side surfaces S1 of the front part 210. The front part 210 of each server 200 also has a fastening block 211.

The two connecting rod assemblies 300 are respectively disposed on the two sets of servers 200, and the two sets of connecting rod assemblies 300 are respectively fastened to the back section 122 of the partition plate 120 and the case body 110. An example with the connecting rod assembly assemblies 300 fastened to the back section 122 of the partition plate 120 is explained as follows. The connecting rod assembly assemblies 300 include a first connecting rod 310, a second connecting rod 320, a third connecting rod 330 and a fastener 340. The first connecting rod 310 is pivoted on the front part 210 of the server 200. The second connecting rod 320 is pivoted on the back part 220 of the server 200. An end of the third connecting rod is pivoted on the first connecting rod 310, and another end of the third connecting rod 330 is pivoted on the second connecting rod 320. An end of the second connecting rod 320 far from the third connecting rod 330 includes a fastening block 321 and a pushing block 322. The fastener 340 is pivoted on the first connecting rod 310, and the fastener 340 has a fastening groove 341. The fastening groove 341 may be fastened to the fastening block 211, so that the third connecting rod 330 drives the fastening block 321 of the second connecting rod 320 to protrude from a side surface S2 of the back part 220 and be fastened to the fastening slot 122a of the back section 122 of the partition plate 120. When the fastening groove 341 is separated from the fastening block 211, the first connecting rod 310 is rotated relative to the server 200, so that the fastening block 321 of the second connecting rod 320 is separated from the fastening slot 122a of the back section 122 of the partition plate 120, and the fastening block 321 of the second connecting rod 320 moves into the subspace 111a from the side surface S2 of the back part 220. Further, a side of the back section 122 of the partition plate 120 close to a side of the opening 112 is pushed by the pushing block 322, so that the server 200 is drawn out from the chassis 100.

In this embodiment, the first connecting rod 310 is pivoted on the fastener 340 by a first pivotal pin 361. The first connecting rod 310 is pivoted on the third connecting rod 330 by a second pivotal pin 362. The first connecting rod 310 is pivoted on the front part 210 of the server 200 by a third pivotal pin 363. Further, when the fastening groove 341 is fastened to the fastening block 211, a first projected length on a front side 212 of the server 200 between a central axis of the first pivotal pin 361 and a central axis of the third pivotal pin 363 is D1, and a second projected length on the front side 212 of the server 200 between a central axis of the second pivotal pin 362 and the central axis of the third pivotal pin 363 is D2. A ratio of the first projected length D1 to the second projected length D2 is 7.4 to 2, so that the second connecting rod 320 can be more easily fastened to the fastening slot 122a of the back section 122 of the partition plate 120.

In addition, the second connecting rod 320 is pivoted on the third connecting rod by a fourth pivotal pin 364. The second connecting rod 320 is pivoted on the back part 220 of the server 200 by a fifth pivotal pin 365. When the fastening groove 341 is fastened to the fastening block 211, an angle θ is enclosed by a baseline L and a connecting line between a central axis of the fourth pivotal pin 364 and a central axis of the fifth pivotal pin 365, and a connecting line of the central axis of the second pivotal pin 362 and the central axis of the fourth pivotal pin 364 is not orthogonal to the front side 212 of the server 200. In this embodiment, the baseline L is parallel to the front side of the server 200, and the angle θ is an acute angle; therefore, a risk of the latch being separated from the chassis is reduced by applying a component force of an external force to the fourth pivotal pin 364 through the second connecting rod 320. In this embodiment, the angle θ is 8.53 degrees.

Figure 5:
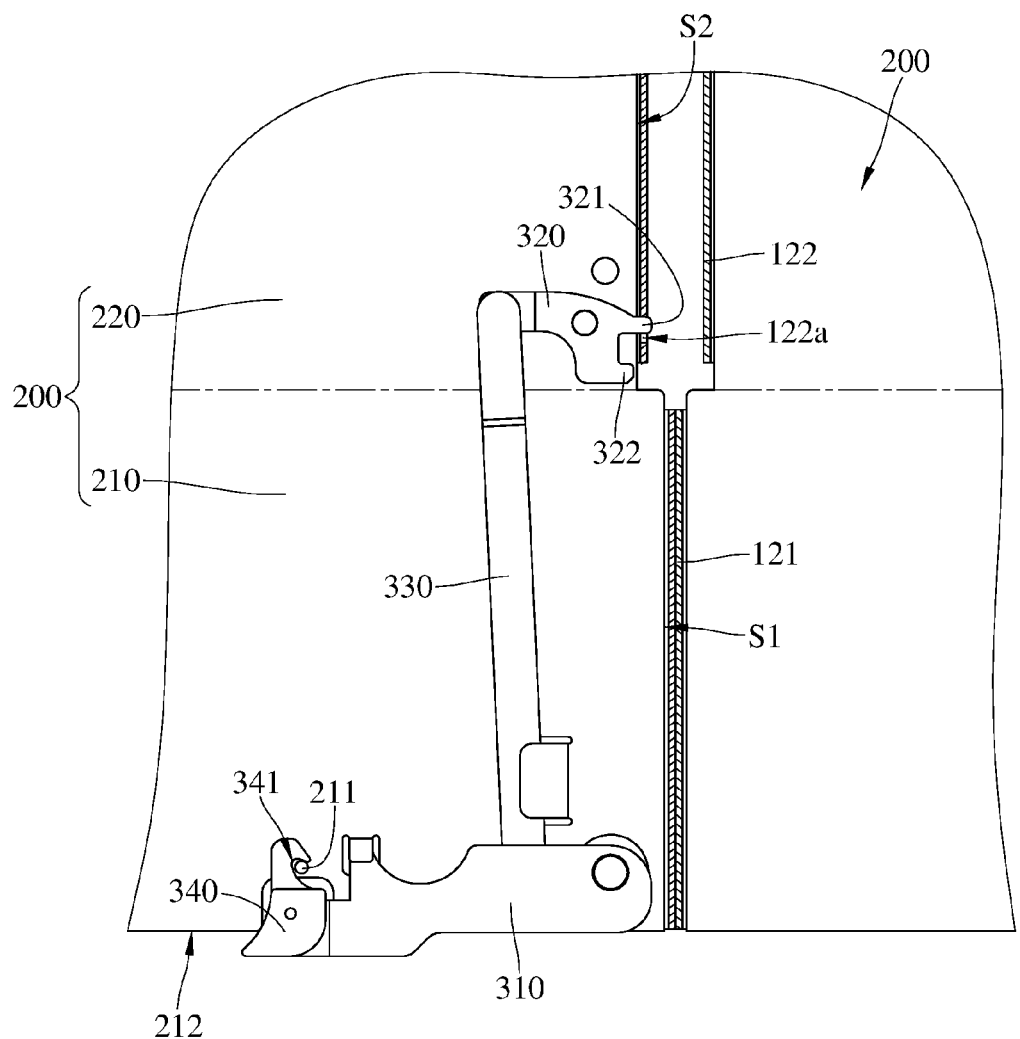
FIG. 5 and FIG. 6 are perspective views of actions of the server device in FIG. 1.
Figure 6:
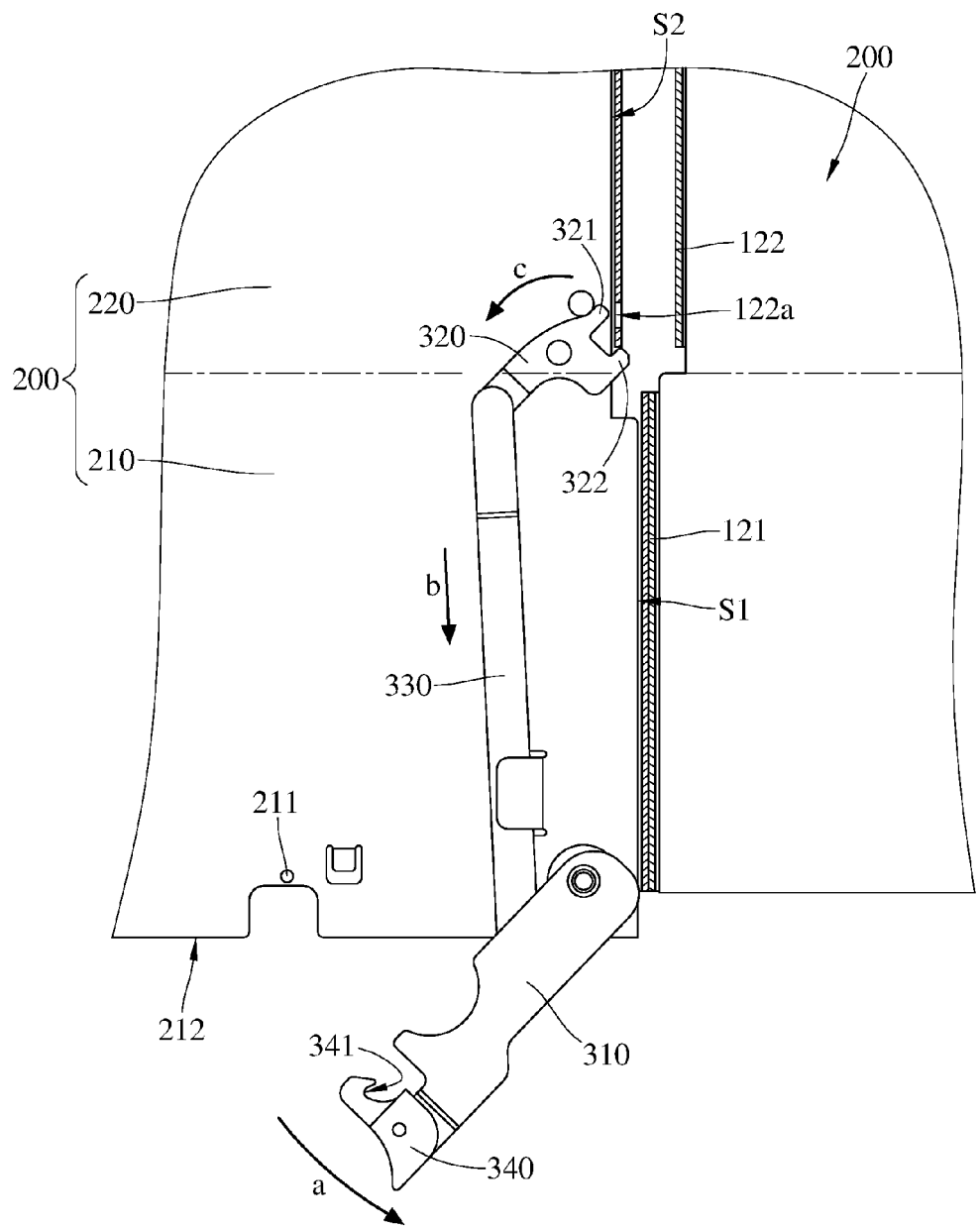

Please refer to FIG. 5 to FIG. 6. FIG. 5 and FIG. 6 are perspective views of actions of the server device in FIG. 1. As shown in FIG. 5, when the fastening groove 341 is fastened to the fastening block 211, the fastening block 321 of the second connecting rod 320 protrudes from a side surface S2 of the back part 220 and is fastened to the fastening slot 122a of the back part 122 of the partition plate 120.

As shown in FIG. 6, when the fastening groove 341 is separated from the fastening block 211, the first connecting rod 310 is rotated relative to the server 200 along a direction shown as an arrow a, so that the third connecting rod 330 is moved along a direction shown as an arrow b. The second connecting rod 320 is rotated relative to the server 200 to move the third connecting rod 330 along a direction shown as an arrow c, so that the fastening block 321 of the second connecting rod 320 is separated from the fastening slot 122a of the back section 122 of the partition plate 120, and the fastening block 321 of the second connecting rod 320 moves into the subspace 111a from the side surface S2 of the back part 220. After the fastening block 321 is separated from the partition plate 120, a side of the back section 122 of the partition plate 120, close to the opening 112, is pushed by the pushing block 322, so that the server 200 is drawn out from the chassis 100.

In this embodiment, the width W4 of the back section 122 of the partition plate 120 is greater than the width W3 of the front section 121; in other words, a distance between the two back parts 220 of the two servers 200 is larger than a distance between the two front parts 210. The arrangement of the third connecting rod 330 is favorable for the fastening position of the second connecting rod 320 to be located on the back section 122 of the partition plate 120. Therefore, a part of the second connecting rod 320 which is fastened to the fastening slot 122a can have a larger length without interfering with the adjacent servers 200. Hence, the assembly reliability of the servers 200 and chassis 100 are enhanced.

According to the server of the aforementioned embodiment, a fastening position of the second connecting rod is moved back to a back section of a partition plate by pivoting the third connecting rod. Therefore, a length for fastening the second connecting rod to a fastening slot may be further lengthened on the premise that the adjacent servers do not interfere with each other. Hence, the assembly reliability of the servers and chassis are enhanced.

The foregoing description, for the purpose of explanation, has been described with reference to specific embodiments; however. The embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. A server device, comprising:
a chassis having an accommodating space and an opening, and the opening connected to the accommodating space;
at least one server located in the accommodating space and being drawable from the opening, the at least one server comprising a front part and a back part, the back part being farther from the opening than the front part, and a width of the front part being greater than a width of the back part; and
at least one connecting rod assembly disposed on the at least one server, the at least one connecting rod assembly comprising a first connecting rod, a second connecting rod and a third connecting rod, the first connecting rod pivoted on the front part of the at least one server, the second connecting rod pivoted on the back part of the at least one server, an end of the third connecting rod pivoted on the first connecting rod, and another end of the third connecting rod pivoted on the second connecting rod;
wherein the first connecting rod is rotatable relative to the at least one server to move the third connecting rod, so that the third connecting rod drives the second connecting rod to protrude from a side surface of the back part and fasten to the chassis.

2. The server device according to claim 1, wherein the chassis comprises a case body and a partition plate, the accommodating space and the opening are located on the case body, the partition plate is located in the accommodating space to divide the accommodating space into two subspaces, the at least one server is located in one of the two subspaces.

3. The server device according to claim 2, wherein the partition plate comprises a front section and a back section, the back section is farther from the opening than the front section, a width of the front section is less than a width of the back section, the second connecting rods of the at least one connecting rod assemblies is respectively fastened to the back section of the partition plate and the case body.

4. The server device according to claim 3, wherein an end of the second connecting rod being far from the third connecting rod comprises a fastening block and a pushing block, the fastening block of the second connecting rod protrudes from a side of the back part and is fastened to the back section of the partition plate, the pushing block is for pushing a side of the back section close to the opening, so that the at least one server is drawn out relative to the chassis.

5. The server device according to claim 1, wherein the at least one server has a fastening block, and the at least one connecting rod assembly further comprises a fastener pivoted on the first connecting rod, and the fastener has a fastening groove, the second connecting rod is fastened to the chassis when the fastening groove is fastened to the fastening block.

6. The server device according to claim 5, wherein the first connecting rod is pivoted on the fastener by a first pivotal pin; the first connecting rod is pivoted on the third connecting rod by a second pivotal pin; the first connecting rod is pivoted on the front part of the at least one server by a third pivotal pin; when the fastening groove is fastened to the fastening block, a first projected length on a front side of the at least one server between a central axis of the first pivotal pin and a central axis of the third pivotal pin is D1; a second projected length on the front side of the at least one server between a central axis of the second pivotal pin and the central axis of the third pivotal pin is D2; and a ratio of the first projected length D1 to a second projected length D2 is 7.4 to 2.

7. The server device according to claim 6, wherein the second connecting rod is pivoted on the third connecting rod by a fourth pivotal pin; the second connecting rod is pivoted on the back part of the at least one server by a fifth pivotal pin; when the fastening groove is fastened to the fastening block, an angle is enclosed by a connecting line between a central axis of the fourth pivotal pin and a central axis of the fifth pivotal pin and the front side of the at least one server; and the angle is an acute angle.

8. The server device according to claim 7, wherein the angle is 8.53 degrees.

9. The server device according to claim 7, wherein a connecting line of the central axis of the second pivotal pin and the central axis of the fourth pivotal pin is not orthogonal to a front end of the at least one server.

* * * * *